(12) United States Patent
Ju et al.

(10) Patent No.: US 6,338,930 B1
(45) Date of Patent: Jan. 15, 2002

(54) POSITIVE PHOTORESIST LAYER AND A METHOD FOR USING THE SAME

(75) Inventors: Jin-Ho Ju, Seoul; Yu-Kyung Lee; Hong-Sik Park, both of Yongin; Yun-Jung Nah, Suwon; Ki-Soo Kim, Anyang; Sung-Chul Kang, Seongnam, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/654,927

(22) Filed: Sep. 5, 2000

(30) Foreign Application Priority Data

Sep. 6, 1999 (KR) .............................. 99-37690

(51) Int. Cl.$^7$ .............................. G03C 1/74; G03F 7/16
(52) U.S. Cl. .................. 430/168; 430/191; 430/192; 430/193; 430/270.1; 430/326; 427/123; 427/145; 427/425; 427/426
(58) Field of Search ............................. 430/270.1, 168, 430/191, 192, 326, 193; 427/123, 145, 425, 426

(56) References Cited

U.S. PATENT DOCUMENTS

| | | | |
|---|---|---|---|
| 5,110,706 A | 5/1992 | Yumoto et al. | 430/191 |
| 5,482,816 A | 1/1996 | Murata et al. | 430/270.14 |
| 5,849,454 A | 12/1998 | Namba et al. | 430/191 |
| 6,053,977 A | 4/2000 | Konishi | 118/320 |
| 6,165,681 A | 12/2000 | Hall-Goulle et al. | 430/270.1 |
| 6,207,231 B1 | 3/2001 | Tateyama et al. | 427/240 |
| 6,228,561 B1 | 5/2001 | Hasebe et al. | 430/311 |

*Primary Examiner*—John S. Chu
(74) *Attorney, Agent, or Firm*—Howrey Simon Arnold & White, LLP

(57) ABSTRACT

A method for preparing a positive photoresist layer is provided. In this method, a photoresist composition is dropwise applied on an insulator layer or a conductive metal layer formed on a substrate. The photoresist composition includes a polymer resin, a sensitizer for changing solubility of the photoresist layer when exposed and a solvent. The coated substrate is rotated at the speed of 1,250 to 1,350 rpm for 4.2 to 4.8 seconds. The coated substrate is then dried and the dried substrate is exposed to some form of radiation. Next, the exposed portion is removed by using an alkaline developing solution. The solvent preferably includes 3-methoxybutyl acetate and 4-butyrolactone, or includes 3-methoxybutyl acetate, 2-heptanone, and 4-butyrolactone.

7 Claims, No Drawings

POSITIVE PHOTORESIST LAYER AND A METHOD FOR USING THE SAME

BACKGROUND OF THE INVENTION (a) Field of the Invention

The present invention relates to a positive photoresist layer and a method for manufacturing fine circuit patterns such as liquid crystal display circuits or semiconductor integrated circuits and, using the same. More particularly, it is related to a positive photoresist layer that can be prepared easily and environmentally friendly, as well as obtaining good characteristics.

(b) Description of the Related Art

For producing fine circuit patterns such as those used in liquid crystal display (LCD) circuits or semiconductor integrated circuits, a photoresist composition is uniformly coated or applied on an insulator layer or a conductive metal layer on a substrate. The coated or applied substrate is then exposed to some form of radiation, such as ultraviolet light, electrons, or X-ray, and the exposed substrate is developed to produce a desired pattern. The developed substrate is etched with a mask to remove the insulator layer or the conductive metal layer and the residual photoresist layer is removed to complete the transfer of the tiny pattern onto the substrate surface. Photoresist compositions are classified into a negative type and a positive type depending on whether the exposed areas of photoresist coating become insoluble or soluble. Recently, positive type photoresist compositions have been mainly used, because the positive type photoresists can form smaller patterns than the negative type photoresists.

The photoresist layer preparation is critical and important and determines the production line output. The production line depends on the properties of photoresist compositions. The properties include the photosensitivity, contrast, resolution, resist adhesion, retention, and safety.

Photosensitivity refers to how fast the photoresist's solubility changes. A high photosensitivity is important for a photoresist, particularly in applications that requires a number of exposures. Examples are generating multiple patterns by a repeated process, or employs light of reduced intensity, such as a projection exposure technique that passes light through a series of lenses and monochromatic filters.

Contrast refers to a comparison of the percentage of film loss in the exposed development area with the percentage of film loss on the unexposed area. Ordinarily, the substrate is developed until the coating on the exposed area is completely dissolved away, and thus, development contrast can be determined simply by measuring the percentage of the film coating loss in the unexposed areas when the exposed coating areas are removed entirely.

Photoresist resolution refers to the capability of how finely a mask utilized during exposure can engrave a pattern. In many industrial applications, particularly in manufacturing LCDs or semiconductor integrated circuits, a photoresist is required to provide a high degree of resolution for very small line and space widths of $\mu$ or less.

Because solvents in the photoresist composition are mostly evaporated, the odor or the safety of the evaporated solvent has a great impact on the overall procedure.

Various attempts have been made in the prior art to improve photoresist layer preparation. For example, in U.S. Pat. No. 4,115,128, an organic acid cyclic anhydride was added to the phenolic resin and naphthoquinone diazide sensitizer to increase photosensitivity. Korean Patent Publication No. 94-7775 discloses that a novolak resin, an o-quinone diazide sensitizer, and a propylene glycol alkyl ether acetate solvent are mixed to prepare a photoresist composition and the photoresist composition is coated on a substrate. Next, 70 to 99% of the solvent is evaporated. After removing the solvent, the substrate is exposed to some form of radiation, such as ultraviolet light, electrons, or X-rays. Finally, the composition is removed from the exposed area by using an alkaline developing solution.

Various solvents for improving physical properties of the photoresist composition and work safety, have been developed. For example, ethylene glycol mono ethyl ether acetate, ethyl lactate or propylene glycol mono ethyl ether acetate may be used as solvent. However, the photoresist composition including ethyl lactate shows poor substrate adhesion and difficulty in coating uniformly on a substrate. Ethylene glycol mono ethyl ether acetate or propylene glycol mono ethyl ether acetate is toxic and has an unpleasant odor. Accordingly, there is still a need for photoresist compositions that are suitable for various industrial applications, without sacrificing any one of the properties of photosensitivity, contrast, resolution, or solubility of polymer resin.

SUMMARY OF THE INVENTION

It is an object of the present invention to provide a positive photoresist layer that can improve properties such as good photosensitivity, retention, contrast, resolution, and substrate adhesion of the photoresist layer.

It is another object to provide a positive photoresist layer that is not toxic to humans, without unpleasant odor, and is environmentally friendly.

It is still another object to provide a positive photoresist layer that can reduce the photoresist layer production time and improve work efficiency.

These and other objects may be achieved by a method of the present invention. In this method, a photoresist composition is drop-wise applied on an insulator layer or a conductive metal layer formed on a substrate. The photoresist composition includes a polymer resin, a sensitizer for changing solubility of the photoresist layer when exposed, and a solvent. The resulting substrate is rotated at the speed of 1,250 to 1,350 revolution per minute (rpm) for 4.2 to 4.8 seconds. As a result, the composition is coated on the substrate. The coated substrate is then dried and the dried substrate is exposed to some form of radiation. Next, the exposed portion is removed by using an alkaline developing solution. The solvent preferably includes 3-methoxybutyl acetate and 4-butyrolactone, or includes 3-methoxybutyl acetate, 2-heptanone, and 4-butyrolactone.

DETAILED DESCRIPTION OF THE INVENTION

A photoresist composition for producing a photoresist layer generally includes a polymer resin, a sensitizer, and a solvent. The photoresist composition of the present invention can be applied to a substrate by any conventional method used in the photoresist art, including dipping, spraying, whirling, and spin coating. In the present invention, the photoresist composition is drop-wise applied to a substrate and the substrate is rotated at the speed of 1,250 to 1,350 rpm for 4.2 to 4.8 seconds. As a result, the composition is uniformly coated on the substrate. Furthermore, the photoresist solution can be adjusted by changing the percentage of solid contents in order to provide a coating of the desired thickness given the type of spinning equipment utilized and the spinning process. Suitable substrates include silicon, aluminum, silicon dioxide, doped silicon dioxide, silicon nitride, tantalum, copper, polysilicon, ceramics, and aluminum/copper mixtures or polymeric resins.

The substrate coated with photoresist composition is heated at 20° C. to 100° C. to perform a soft-baking step. This step permits the solvent evaporation without pyrolysis of a solid component in the photoresist composition. Generally, it is preferable that the solvent concentration of the solvent is reduced to minimum by the soft-baking step. Thus, the substrate is soft-baked until the solvent is mostly evaporated and a thin coating layer of photoresist remains on the substrate. The photoresist composition used in the present invention is extremely sensitive to the temperature. Thus it is desirable to perform the process in one pre-heating step, which allows the photoresist to be stripped without defects in the following steps.

Next, the substrate coated with the photoresist layer is selectively exposed to light, particularly, ultraviolet light using a suitable mask to obtain a desirable pattern. The illuminance of an ultraviolet lamp is preferably 100 to 103 mW and the exposure time is preferably 800 to 900 msec.

The exposed substrate is then dipped into an aqueous alkaline developing solution until the exposed photoresist layer is almost entirely dissolved. Suitable aqueous developing solutions include an aqueous solution including alkaline hydroxides, ammonium hydroxide, or tetramethylammonium hydroxide (TMAH).

The substrate is then taken out from the developing solution and heat-treated to improve and to increase the chemical resistance of the photoresist layer. This step is called a hard-baking step. The substrate is hard-baked at a temperature below the softening point of the photoresist layer, preferably at about 90° C. to 150° C.

The substrate is etched with an etchant or with vapor plasma to eliminate the exposed portion. The residual photoresist protects the substrate regions that are covered. The photoresist layer is then removed from the etched substrate using a stripper to complete the patterning onto the substrate surface.

The polymer resins employed in a photoresist composition of the present invention are well known in the related arts. A novolak resin, an exemplary polymer resin, may be employed in a photoresist composition of the present invention. The novolak resin is produced by reacting aromatic alcohol such as phenol, meta and/or para cresol with formaldehyde. For improving the performance of the photoresist, the molecular weight of the resin may be controlled by removing resins of high, medium or low molecular weight depending on the purpose of the photoresist. The useful diazide compound sensitizer may be produced by reacting polyhydroxy benzophenone with a diazide-based compound such as 1,2-naphtoquinonediazide or 2-diazide-1-naphtol-5-sulfonic acid.

The solvent includes 3-methoxybutyl acetate and 4-butyrolactone. The ratio of 3-methoxybutyl acetate:4-butyrolactone is 60 to 80:2 to 10 parts by weight, and more preferably 65 to 75:2 to 5 parts by weight. If the amount of 3-methoxybutyl acetate exceeds the above range, the viscosity of the composition decreases such that the retention becomes poor. Whereas, 3-methoxybutyl acetate less than the above range increases the viscosity too much and degrades the ability to coat. The 4-butyrolactone exceeding the above range reduces, the retention. Whereas, 4-butyrolactone less than the above range may not render homogeneous composition and form particles easily on the substrate.

Alternatively, the solvent may include 3-methoxybutyl acetate, 2-heptanone, and 4-butyrolactone. The ratio of 3-methoxybutyl acetate:2-heptanone:4-butyrolactone is preferably 50 to 70:5 to 15:2 to 10 parts by weight, and more preferably 55 to 65:7 to 13:2 to 5 parts by weight.

If the amount of 3-methoxybutyl acetate exceeds the above range, the viscosity of the composition decreases and the thickness of the photoresist layer becomes thin and retention becomes poor. Whereas, 3-methoxybutyl acetate lower than the above range increases the viscosity such that the thickness of the layer increases too much and the photosensitivity is reduced. If the amount of 2-heptanone exceeds the above range, the composition is difficult to use because of its unpleasant odor. Also, the viscosity of the composition decreases and the thickness of the layer becomes thin. Whereas, 2-heptanone less than the above range raises the viscosity of the composition too much and reduces the photosensitivity. 4-butyrolactone exceeding the above range reduces the retention. Whereas, 4-butyrolactone less than the above range reduces the solubility of the sensitizer such that the homogeneous composition is not obtained and particles are formed easily on the substrate.

In the present invention, the photoresist composition includes preferably about 10 to about 25 wt % of the polymer resin, about 4 to 10 wt % of the sensitizer, and 65 to 85 wt % of the solvent. If the amount of the polymer resin is less than 10 wt %, the adhesion to the substrate is reduced and the produced profile becomes bad. Whereas, polymer resin more than 25 wt % increases the viscosity too much and reduces the photosensitivity and the coatability. If the amount of the sensitizer is less than 4 wt %, the resolution is reduced and the profile becomes bad. Whereas, if the amount thereof is more than 10 wt %, scums or particles are easily formed in coating the photoresist composition on the substrate.

Additives such as a colorants, dyes, anti-striation agents, plasticizers, adhesion promoters, speed enhancers, and/or surfactants may be added to the photoresist composition of the present invention. Such additives help to improve the performance of the photoresist composition.

The following examples further illustrate the present invention.

EXAMPLE 1

A photoresist composition including 6.43 wt % of a sensitizer, 19.47 wt % of a polymer resin, 70.4 wt % of 3-methoxybutyl acetate, and 3.70 wt % of 4-butyrolactone was drop-wise applied to 4 inch bare glass plates and the glass plates were then rotated at a constant rate. The resulting glass plates were heat-dried at 135° C. for 90 seconds to obtain a photoresist film layer with a thickness of 1.60$\mu$ on the glass. The glass plates were then exposed to ultraviolet light using a mask and dipped into a 2.38% tetramethyl ammonium hydroxide (TMAH) aqueous solution for 75 seconds to remove the exposed portions and obtain photoresist patterns.

While changing the light intensity, the glass plates were exposed using a 50$\mu$ line and space pattern as a mask to produce spots on the substrate and the thickness of the remaining layer in the spot was measured. It was found that the photoresist composition had a good photosensitivity. Furthermore, since the thickness is linearly increased as the spin speed increases, the layer thickness can be predicted when the spin speed is changed.

EXAMPLE 2

A photoresist composition including 6.43 wt % of a sensitizer, 19.47 wt % of a polymer resin, 59.3 wt % of 3-methoxybutyl acetate, 11.1 wt % of 2-heptanone and 3.70 wt % of 4-butyrolactone was drop-wise applied to 4 inch bare glass plates and the glass plates were then rotated at a constant rate. Then, the glass plates were heat-dried at 135° C. for 90 seconds to obtain a photoresist film layer with a thickness of 1.60$\mu$ on the glass. The resulting glass plates were exposed to ultraviolet light using a mask and then dipped into a 2.38% tetramethyl ammonium hydroxide (TMAH) aqueous solution for 75 seconds to remove the exposed portions and obtain photoresist patterns.

While changing the light intensity, the exposing step was performed using a 50$\mu$ line and space pattern as a mask to produce spots on the substrate and the thickness of the remaining layer in the spot was measured. It was found that the photoresist composition had a good photosensitivity. While changing the rotating speed from 950 rpm to 1,400 rpm, the glass plates were soft-baked at 90° C. and 135° C. for 90 seconds, respectively. The thicknesses of layer (Tpr, $\mu$) were measured and the results are presented in Table 1.

TABLE 1

| | 950 rpm | | 1,100 rpm | | 1,250 rpm | | 1,400 rpm | |
|---|---|---|---|---|---|---|---|---|
| | 90° C. | 135° C. | 90° C. | 135° C. | 90° C. | 135° C. | 90° C. | 135° C. |
| Example 2 | 1.635 | 1.508 | 1.590 | 1.463 | 1.531 | 1.407 | 1.461 | 1.348 |

As shown in Table 1, the layers produced by using the photoresist composition of the present invention have thin thicknesses. Furthermore, since the thickness is linearly increased as the spin speed increases, layer thickness can be effectively predicted when the spin speed is changed.

The positive type photoresist composition of the present invention has good physical properties, such as photosensitivity and Tpr, so that the composition can be easily applied to industrial applications. Furthermore, the composition is without an unpleasant odor so that it can contribute to a favorable work environment.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method for preparing a positive photoresist layer, comprising the steps of:

coating a photoresist composition on an insulator layer or a conductive metal layer formed on a substrate by dropping the photoresist composition on the insulator layer or the conductive metal layer and rotating the substrate at a speed of 1,250 to 1,350 rpm for 4.2 to 4.8 seconds, the photoresist composition including a polymer resin, a sensitizer for changing solubility of the photoresist layer when exposed and a solvent;

drying the coated substrate;

exposing the dried substrate; and removing the exposed portion by using an alkaline developing solution.

2. The method of claim 1, wherein the solvent includes 3-methoxybutyl acetate and 4-butyrolactone.

3. The method of claim 2, wherein the ratio of 3-methoxybutyl acetate:4-butyrolactone is 60 to 80:2 to 10 parts by weight.

4. The method of claim 1, wherein the solvent includes 3-methoxybutyl acetate, 2-heptanone, and 4-butyrolactone.

5. The method of claim 4, wherein the ratio of 3-methoxybutyl acetate:2-heptanone:4-butyrolactone is 50 to 70:5 to 25:2 to 10 parts by weight.

6. The method of claim 1, wherein the polymer resin is a novolak resin and the sensitizer is a diazide-based compound.

7. The method of claim 1, wherein the photoresist composition includes 10 to 25 wt % of the polymer resin, 4 to 10 wt % of the photosentive compound, and 65 to 85 wt % of the solvent.

* * * * *